PHOTOSENSITIVE FIELD EFFECT UNIT

Filed Dec. 18, 1959

INVENTOR

Edward M. Davis

BY Sughrue, Rothwell, Mion & Zinn
ATTORNEYS

United States Patent Office 3,051,840

Patented Aug. 28, 1962

3,051,840

PHOTOSENSITIVE FIELD EFFECT UNIT

Edward M. Davis, Poughkeepsie, N.Y., assignor to International Business Machines Corporation, New York, N.Y., a corporation of New York Filed Dec. 18, 1959, Ser. No. 860,466
7 Claims. (Cl. 250—211)

This invention relates to photosensitive semiconductor devices and more particularly to photosensitive semiconductor devices of the field effect type.

The photoconducting process in semiconductors is well known in the prior art. For example, section 5 of Handbook of Semiconductor Electronics by L. P. Hunter, McGraw-Hill, 1956, discusses this photo-conducting process in some detail. Photodiodes have been constructed of the grown junction, alloy junction and point contact types. P-N junction photocells operate on the principle that incident light upon the junction causes a change in the current through the junction. A typical P-N junction has a sensitivity of approximately 30 milliamperes per lumen of light incident upon the junction. While this sensitivity is quite sufficient for most applications, there are many applications where it would be desirable to use a photosensitive device having a greater sensitivity.

Field effect transistors are also well known to the prior art and are described, for example, in section 1.8 of Handbook of Semiconductor Electronics by L. P. Hunter, McGraw-Hill, 1956. These devices generally consist of a bar of semiconductor material whose resistance is modulated by varying the effective cross sectional area of the bar by electrical means. The bar is flanked by two regions of semiconductor material of the opposite conductivity type to the conductivity type of the bar. For example, an N-type bar of germanium is flanked by two regions of P-type germanium. The conduction current to be modulated is carried between the ends of the bar; one end being designated the source and the other end being designated the drain. The current through the bar is modulated by varying the reverse bias between the two P-type regions and the N-type bar. At a certain value of reverse bias the depletion regions at the junctions between the two regions of P-type material and the N-type material will become so large as to overlap and the current through the bar is "pinched off." These devices have the desirable characteristics of high input impedance, moderately high output impedance, high frequency response and small internal feedback between input and output as contrasted with the conventional point contact or junction-type transistor.

In accordance with the subject invention, the desirable characteristic of field effect transistors are incorporated into a photo-sensitive device.

Accordingly, it is an object of the present invention to provide a photosensitive device making use of the field effect.

It is another object of the present invention to provide a photo-sensitive device having a much greater sensitivity than prior art devices.

It is a further object of the present invention to provide a field effect transistor in which the "pinch off" occurs to a surface rather than between opposing depletion regions.

It is a further object of the present invention to provide a field effect unit in which incident light forms whole-electron pairs at a distance less than a recombination length away from the P-N junction.

These and other objects of the invention which will become apparent as the description proceeds are achieved by providing a field effect unit having a channel of semiconductive material between source and drain which is quite thin. This thin slab of semiconductor material is contiguous to a single region of semiconductive material of the opposite conductivity type as contrasted to prior art field effect units in which the body of semiconductive material between source and drain is flanked by two regions of semiconductor material of the opposite conductivity type. By providing a very thin slab of semiconductor material between source and drain, the "pinch off" of the source-to-drain current occurs at the surface of the slab instead of between opposing depletion regions as in prior art devices. Light is focused upon the very thin channel region of the field effect device. Because the channel region is thin, the hole-electron pairs formed by light striking the channel are, in general, less than a recombination length away from the P-N junction. Prior art field effect transistors could not be used as photosensitive devices since the distance from any surface to a junction of the device is more than a recombination length. Further, even if the junctions of prior art field effect transistors had been constructed so that the junctions were close to the surface, they could not have been used as photosensitive devices since "pinch off" is caused by opposing depletion regions at the two junctions. Thus, at the most, only one depletion region would be affected by incident light. In the subject device, "pinch off" occurs at only one surface and the depletion region is well within a recombination length of the surface upon which light is incident. Incident light modulates the current flowing between source and drain in such a manner that a high sensitivity to incident light is obtained.

For a better understanding of the invention, reference should be made to the accompanying drawing wherein.

Figure 1:
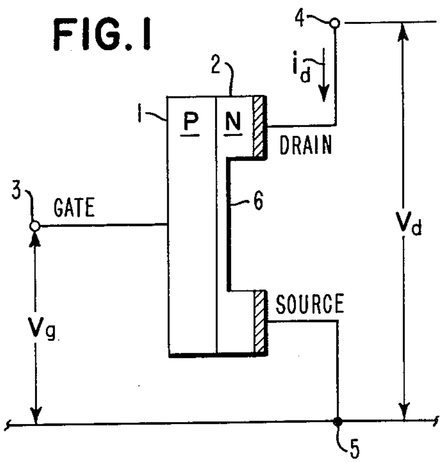
FIGURE 1 shows the basic field effect unit of the subject invention.

Referring particularly to FIGURE 1, there is shown this basic field effect unit of the subject invention. The unit itself comprises, in the example shown, a body of P-type semiconductor material 1, which is contiguous with a slab of N-type semiconductor material 2. A terminal 3 is connected to the P-type semiconductor to provide a gate terminal. A voltage $V_g$ is applied to the gate terminal 3 for biasing. A terminal 4 is connected to the upper end of the N-type semiconductor material to form a drain terminal. Similarly another terminal 5 is connected to the lower side of the N-type material to form a source terminal. A channel region 6, between the drain terminal and the source terminal, is very thin. Current from the drain to the source is designated $i_d$.

Figure 2:
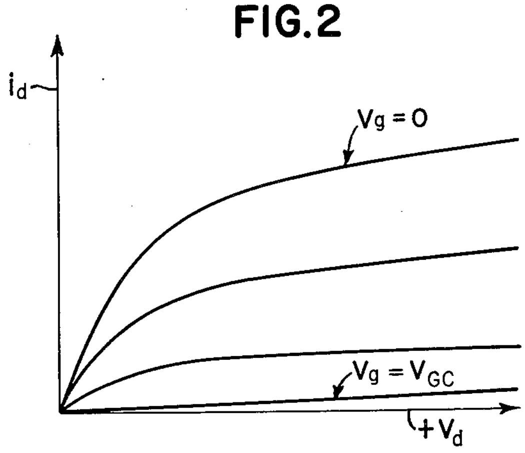
FIGURE 2 shows terminal characteristics of the field effect unit.

The depletion region in the N-type semiconductor material, produced by applied back-bias voltage between the gate terminal 3 and the source terminal 5 and by the ohmic drop in the channel 6, modulates the effective conductivity of the channel 6. This effect results in device characteristics as shown in FIGURE 2. In FIGURE 2 there is shown the drain current, $i_d$, versus drain voltage, $V_d$, for various values of gate voltage, $V_g$. It can be seen that when $V_g$ is equal to a critical value, designated $V_{gc}$, there is "pinch off" of the channel between the drain and source and very little drain current will flow through the channel regardless of the drain voltage, $V_d$, applied to the train terminal. At this critical value of gate voltage, the depletion region in the N-type semiconductor material is so wide that there is very little conduction through the channel. The characteristic curves shown in FIGURE 2 very much resemble the characteristics of a pentode vacuum tube and the field effect device can be analogized in many respects to such a tube.

A photo-sensitive field effect unit such as the one shown in FIGURE 1 may be constructed in the following manner. The initial wafer is a bar of four ohm-centimeter P-type germanium which is approximately 35 mils long and 4 mils thick. One surface of this wafer has a diffused N-type skin to a depth of approximately 0.14 mil. Source, drain and gate terminals are alloyed onto the wafer. The drain terminal is a brush plated washer which is bonded to the N-type region in a conventional manner by heating the assembly to a temperature wherein the tin plating melts and bonds the washer to the surface of the germanium. This washer is preferably made of nickel which receives a conventional tin lead plating. The source terminal is a 5 mil sphere of a lead antimony alloy containing about 90% lead and 10% antimony. The dot is alloyed in the conventional manner to the N region to form an ohmic contact. The gate terminal is an indium dot and is alloyed to the P region to produce an ohmic contact. Black wax is then placed on top of the unit and the junction is etched for 15 seconds at ½ amp. in sodium hydroxide to remove low resistance material from about the PN junction. The black wax is relatively unaffected by sodium hydroxide. After this step the black wax may be removed by dissolving it in a suitable solvent such as trichlorethylene. The channel region of the photosensitive field effect device is then formed by etching the device for 17 seconds in an etching solution such as a CP 8 etching solution which is well known and is used for preferential etching of germanium. This solution may comprise five parts by volume of 70% nitric acid—AR grade, three parts glacial acetic acid—AR grade, and three parts 43% hydrofluoric acid—AR grade. A unit produced in this manner was found to have the following characteristics: $G_m$ equals 1300 micromhos, gate saturation current equals 0.8 microamp. and the approximate area of the channel was $75\times 10^{-6}$ square inches.

Figure 3:
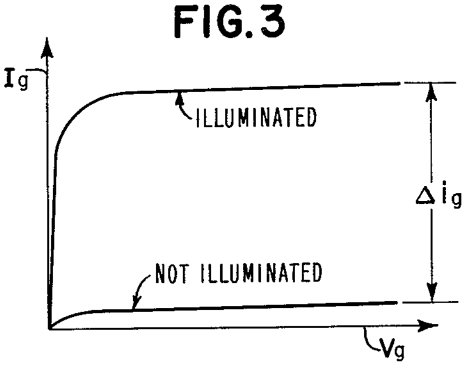
FIGURE 3 shows the response of the gate junction to illumination.

Referring to FIGURE 3, there are shown curves illustrating the response of the field effect device to illumination. In these curves the current through the junction, designated $i_g$, is plotted against gate voltage, designated $V_g$. It has been found, and it can be shown mathematically that the drain voltage and drain current have very little effect upon the response of the junction to illumination. In FIGURE 3 there is shown the junction current, $i_g$, when the device is subjected to illumination and when the device is not subjected to illumination. For each condition, the junction current $i_g$, is fairly constant for all values of gate voltage. The difference in junction current between the illuminated and the not illuminated situation is designated $\Delta i_g$.

Figure 4:
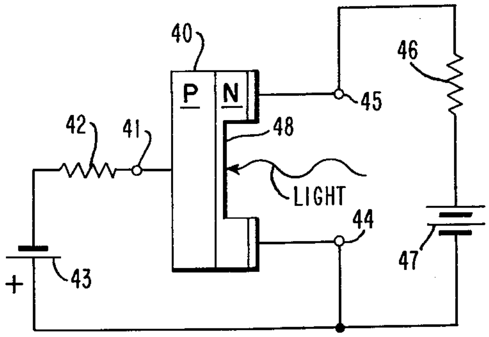
FIGURE 4 shows the basic circuit for a photosensitive field effect unit.

Referring to FIGURE 4, the photosensitive field effect unit is shown connected in a circuit. A field effect unit 40, such as the one described above, has its gate terminal 41 connected through a gate resistor 42 to a source of biasing potential 43. The source of biasing potential is applied between the gate terminal 41 and a source terminal 44. A drain terminal 45 is connected through a load resistor 46 to a source of drain voltage 47. A channel region 48 in the field effect unit is illuminated by light from a suitable source.

The operation of the circuit of FIGURE 4 and the manner in which high sensitivity to incident light is obtained can best be shown mathematically. The voltage on the gate terminal 41 is given by the expression:

$$V_g = V_{GO} - i_g R_g \qquad (1)$$

where $V_g$ is equal to the voltage on the terminal 41, $V_{GO}$ is equal to the voltage of the biasing source 43, $i_g$ is equal to the junction current and $R_g$ is equal to the resistance of the resistor 42. If the junction is illuminated, a change in junction current, designated $\Delta i_g$, will result. This will produce a change in the voltage, $V_g$, due to the increased voltage drop across the resistor 42. This may be given by the expression:

$$\Delta V_g = R_g \Delta i_g \qquad (2)$$

This change in gate voltage will, in turn, result in a change in drain current, $i_d$, equal to:

$$\Delta i_d = \Delta V_g G_m = R_g G_M \Delta i_g \qquad (3)$$

where $\Delta i_d$ is equal to the change in drain current, $\Delta V_g$ is the change in gate voltage, $G_m$ is the transconductance of the field effect device, $R_g$ is the resistance of resistor 42 and $\Delta i_g$ is the change in junction current.

The transconductance of a field effect transistor such as the one shown is typically approximately 1,000 micromhos. The resistance of resistor 42, $R_g$, may typically be chosen to be 3.3 megohms. A typical P-N junction of the type shown has a sensitivity to incident light of 30 milliamperes per lumen. Using the above values, the sensitivity of the subject circuit to incident light can be calculated as follows:

Modifying Equation 3 slightly, we have—

$$\frac{\Delta i_d}{\Delta \text{ lumens}} = R_G G_M \frac{\Delta i_g}{\Delta \text{ lumens}} = 3.3\times 10^6 \times 1.000\times 10^{-6}\times 30\times 10^{-3} = 100\ \frac{\text{amps.}}{\text{lumen}} \qquad (4)$$

A sensitivity of 100 amps. per lumen as obtained by the subject circuit is approximately equal to the sensitivity of a good photomultiplier and 100 times the sensitivity of the best photo transistor.

It should be noted that in the circuit of FIGURE 4 the drain current, $i_d$, is dependent to a great extent upon the junction current, $i_g$, which is extremely temperature dependent in germanium devices. In certain applications, it is, therefore, extremely advantageous to construct the field effect units of silicon rather than of germanium.

Figure 5:
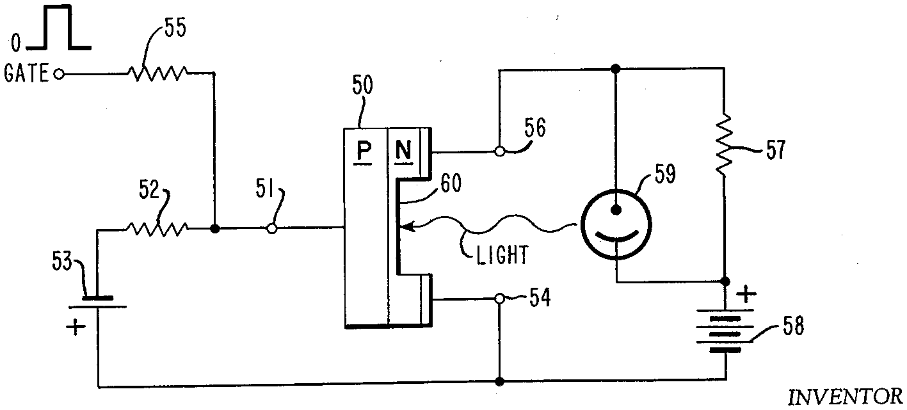
FIGURE 5 shows a light latch.

These photosensitive field effect units may also be used in such applications as card sensing and "light-logic." "Light logic" is a technique by which communication between logic circuits is accomplished by light as well as by currents through conducting paths. An example of the "light-logic" application is the light latch shown in FIGURE 5. Referring to FIGURE 5, a photosensitive field effect device 50 has its gate terminal 51 connected through a gate resistor 52 to a source of biasing potential 53. The biasing potential 53 is connected between the gate terminal 51 and a source terminal 54. Gating pulses are applied through another gate resistor 55 to the gate terminal 51. A drain terminal 56 of the photosensitive field effect device 50 is connected through a load resistor 57 to a source of drain voltage 58. A neon bulb 59 is connected across the load resistor 57. An incandescent light or an electroluminescent source may also be employed. The neon bulb 59 is so positioned that when the bulb 59 is turned on its light will be incident upon a channel region 60 of the photosensitive field effect device 50.

Operation of the circuit of FIGURE 5 is as follows. The unit is initially in the cut-off condition with the neon bulb 59 off. That is, the potential of the source of biasing potential 53 is more than the critical value of back-bias required to maintain the field effect unit 50 in the "pinched off" condition. When a positive gate pulse is applied through the gate resistor 55 to the terminal 51, the channel region 60 between the drain 56 and the source 54 becomes conducting, that is, the junction is driven into the saturation region. Current flows through the load resistor 57 and the neon bulb 59 is fired. The illumination from the neon bulb 59 maintains the field effect unit 50 in the saturated condition after the gate pulse is removed. The unit may be restored to cut-off by applying a negative gating pulse through the resistor 55, by interrupting the drain supply voltage 58, or by interrupting the light path between the neon bulb 59 and the channel 60.

While certain specific embodiments of my invention have been shown and described, it will, of course, be understood that various other modifications may be made without departing from the principles of the invention. The appended claims are therefore intended to cover any such modifications within the true spirit and scope of the invention.

What I claim as new and desire to secure by Letters Patent of the United States is:

1. A photosensitive device comprising a body of semiconductor material of one conductivity type, a thin layer of semiconductor material of the opposite conductivity type, said thin layer being contiguous with said body of semiconductive material, said thin layer being less than a recombination length thick, means for back-biasing the junction formed between said body and said layer, source and drain connections to said body of semiconductor material, an output circuit connected between the source and drain connections including a load and means for biasing the drain connection relative to the source connection so as to supply majority carriers to said body of semiconductor material from said source connection and to collect majority carriers from said body of semiconductor material to said drain connection, and means for directing light against said layer of semiconductor material to control the majority carrier flow in said body of semiconductor material.

2. A photosensitive device in accordance with claim 1 wherein said material is germanium.

3. A photosensitive device in accordance with claim 1 wherein said material is silicon.

4. A photosensitive device comprising a body of semiconductor material of N conductivity type, a thin layer of P-type semiconductor material being contiguous with said body of P-type semiconductor material, said thin layer of N-type semiconductor material being less than a recombination length thick, means for applying a biasing voltage between the P-type body of semiconductor material and the N-type layer of semiconductor material whereby the junction formed between said body and said layer is back-biased, source and drain connections to said body of semiconductor material, an output circuit connected between the source and drain connections including a load and means for biasing the drain connection relative to the source connection so as to supply majority carriers to said body of semiconductor material from said source connection and to collect majority carriers from said body of semiconductor material to said drain connection, and means for directing light against said thin layer of N-type semiconductor material to control the majority carrier flow through said body of semiconductor material.

5. A photosensitive device comprising a body of semiconductor material of one conductivity type, a thin layer of semiconductive material of the opposite conductivity type, said thin layer being contiguous with said body of semiconductor material, said thin layer being less than a recombination length thick, said layer of semiconductor material having a drain terminal connection at one edge thereof, and a source terminal connection at the opposite edge thereof, an output circuit connected between the source and drain connections including a load and means for biasing the drain connection relative to the source connection so as to supply majority carriers to said body of semiconductor material from said source connection and to collect majority carriers from said body of semiconductor material to said drain connection, said body of semiconductor material having a gate terminal connection attached thereto, a source of biasing potential connected between said gate terminal and said source terminal for back-biasing the junction formed between the body of semiconductor material and the layer of semiconductor material, and means for directing light against said layer of semiconductor material whereby current flow between said drain terminal and said source terminal is controlled in accordance with the intensity of said light.

6. The photosensitive device of claim 5 and a load resistor connected to the drain terminal, and a source of drain voltage connected between said load resistor and said source terminal whereby the current through said load resistor is controlled in accordance with the intensity of the illumination incident upon said layer of semiconductor material.

7. The photosensitive device of claim 6 in combination with a source of gate pulses connected to said gate terminal, said gate pulses being of a polarity and a magnitude such as to drive said junction into the saturation region, said source of biasing voltage being of a magnitude sufficient to maintain said semiconductor layer normally in the "pinched off" condition, and a neon bulb connected across said load resistor, said neon bulb being positioned so that light from said neon bulb is incident upon said semiconductor layer whereby said neon bulb is turned on upon the application of a gating pulse and said junction is maintained in the saturated condition by light emanating from said neon bulb.

References Cited in the file of this patent

UNITED STATES PATENTS

| | | |
|---|---|---|
| 2,641,713 | Shive | June 9, 1953 |
| 2,744,970 | Shockley | May 8, 1956 |
| 2,794,863 | Van Roosbroeck | June 4, 1957 |
| 2,846,592 | Rutz | Aug. 5, 1958 |